United States Patent [19]
Talbot et al.

[11] Patent Number: 5,144,225
[45] Date of Patent: Sep. 1, 1992

[54] METHODS AND APPARATUS FOR ACQUIRING DATA FROM INTERMITTENTLY FAILING CIRCUITS

[75] Inventors: Christopher G. Talbot, Menlo Park; Neil Richardson, Palo Alto, both of Calif.

[73] Assignee: Schlumberger Technologies, Inc., San Jose, Calif.

[21] Appl. No.: 737,553

[22] Filed: Jul. 25, 1991

Related U.S. Application Data

[63] Continuation of Ser. No. 332,345, Mar. 31, 1989, abandoned.

[51] Int. Cl.$^5$ ............................................. G01R 15/12
[52] U.S. Cl. ................................. 324/73.1; 324/158 R; 365/200
[58] Field of Search ................. 324/158 R, 73.1; 365/208, 210, 228; 371/5.1, 21.1, 24

[56] References Cited

U.S. PATENT DOCUMENTS

| | | | |
|---|---|---|---|
| 4,277,679 | 7/1981 | Feuerbaum | 324/158 R |
| 4,623,836 | 11/1986 | Frosien et al. | 324/73.1 |
| 4,706,019 | 11/1987 | Richardson | 324/158 R |
| 4,721,909 | 1/1988 | Richardson | 324/158 R |
| 4,768,195 | 8/1988 | Stoner et al. | 371/25 |
| 4,825,167 | 4/1989 | Bayba | 324/393 |
| 4,833,403 | 5/1989 | Tamamura et al. | 324/158 R |
| 4,994,744 | 2/1991 | Glover et al. | 324/309 |

FOREIGN PATENT DOCUMENTS

A0107040 9/1983 European Pat. Off.

OTHER PUBLICATIONS

E. Menzel & E. Kubalek, *Fundamentals of Electron Beam Testing of Integrated Circuits*, 5 Scanning 103–122 (1983).

E. Plies & J. Otto, *Voltage Measurement Inside Integrated Circuit Using Mechanical and Electron Probes*, IV Scanning Electron Microscopy 1491–1500 (1985).

S. Concina, G. Liu, L. Lattanzi, S. Reyfman & N. Richardson, *Software Integration in a Workstation Based E--Beam Tester*, International Test Conference Proceedings (1986).

(List continued on next page.)

*Primary Examiner*—Curtis Kuntz
*Assistant Examiner*—Edward Urban
*Attorney, Agent, or Firm*—Kenneth Olsen; Keith G. W. Smith; Bruce D. Riter

[57] ABSTRACT

Methods and apparatus are disclosed for conditional acquisition of potential measurements in integrated circuits, with the aid of electron-beam probes. The conditional acquisition enables display of waveform images which permit diagnosis of the causes and/or origins of failure in circuits which fail intermittently. Data is acquired in the normal manner on each pass through the test pattern. At the end of each test pattern execution a pass/fail signal from the tester exercising the circuit is used to reject or accept the acquired data. In this fashion, it is possible to accumulate only that data which carries information about the failure of interest and to reject data which does not. Over several test pattern repetitions it is possible to display only that data which shows the failure. Engineers are thus able to efficiently diagnose intermittent failures without the need to change device operating parameters. In one form of the invention, (a) initially a first buffer is defined as a "good-data" buffer and a second buffer is defined as a "temporary-data" buffer; (b) the circuit is probed during application of a test vector pattern to acquire data; (c) the acquired data is summed with stored data from the "good-data" buffer, and the sum is stored in the "temporary-data" buffer; (d) a determination is made whether circuit has failed to operate as expected in response to the pattern and, if the circuit has failed to operate as expected, the second buffer is redefined as a "good-data" buffer and the first buffer is re-defined as a "temporary-data" buffer; and (e) steps (b)–(d) are repeated, such that the data stored in the "good-data" buffer represents failing operation of the circuit.

11 Claims, 10 Drawing Sheets

OTHER PUBLICATIONS

N. Richardson, *E-Beam Probing for VLSI Circuit Debug*, VLSI Systems Design (1987).

S. Concina & N. Richardson *IDS 5000: an integrated Diagnosis System for VLSI*, 7 Microelectronic Engineering (1987).

IDS 5000 Integrated Diagnostic System, (published by Schlumberger/ATE, May, 1988).

S. Concina and N. Richardson, *Workstation Driven E-Beam Prober*, International Test Conference Proceedings, pp. 554–560 (1987).

T. May, G. Scott, E. Meieran, P. Wiener & V. Rao, *Dynamic Fault Imaging of VLSI Random Logic Devices*, International Physics Symposium Proceedings (1984).

H. Feuerbaum, *Electron Beam Testing: Methods and Applications*, 5 Scanning 14-24 (1983).

S. Daniel & L. Hampton, *Diagnosing Yield Problems with E-Beam Probers*, Semiconductor International (Aug., 1988).

S. Harari & C. Talbot, *Chip Diagnosis: A New Methodology*, Evaluation Engineering (Oct., 1987).

J. McLeod, *A New Tool Dramatically Cuts VLSI Debugging Time*, Electronics (Apr. 30, 1987).

*Solving the Navigational Problem in VLSI Debug*, 1 Issues in VLSI Diagnostics & Test, No. 2 (published by Schlumberger/ATE, Oct., 1987).

IDS 4000 Integrated Diagnostic System, (published by Schlumberger/ATE, Aug., 1988).

D. Hall et al., *Rapid Data Acquisition for E-Beam Testing*, International Test Conference Proceedings (Aug. 29-31, 1989).

S. Concina et al., *Workstation-Driven E-Beam Prober*, IEEE 1987 ITC Proceedings, Washington, Sep. 1-3, 1987, pp. 554-560.

E. Miller, *Gated-Pulse Stroboscopy for Passivated Device Imaging*, IEEE 25th Annual Proceedings, Reliability Physics 1987, San Diego, Calif., Apr. 7-9, 1987, pp. 118-125.

D. Machlin et al., *A High Speed Signal Averager for Electron Beam Test Systems*, Microelectronic Engineering, vol. 7, Nos. 2-4, 1987, pp. 201-207.

METHODS AND APPARATUS FOR ACQUIRING DATA FROM INTERMITTENTLY FAILING CIRCUITS

This application is a continuation of application Ser. No. 07/332,345, filed Mar. 31, 1989, now abandoned.

BACKGROUND OF THE INVENTION

1. Field of the Invention

The present invention relates to methods and apparatus for acquiring data representing intermittent failure of a circuit, particularly an integrated circuit.

2. The Prior Art

Debugging of very large scale integrated circuits (VLSI) is an important element of design. Probing internal nodes of integrated circuits plays an increasingly indispensable role in this process.

As device geometries shrink to and below the 1 $\mu$m mark and as packing density and chip complexity increase, the problems of VLSI circuit debug become more and more difficult. Simulation and design verification software relieve many of the problems. Nevertheless, many designs do not yield fully operational, full specification parts without first undergoing lengthy, and expensive, debug phases.

Debugging a chip with any significant level of integration (LSI, VLSI, ULSI) has always been a difficult task. The recent development of electron-beam probe tools and techniques has greatly assisted in overcoming the problems involved in probing internal nodes of integrated circuits for debug and other purposes.

E-beam probing uses the principle of voltage contrast in a scanning electron microscope (SEM). A conventional SEM image is produced by raster-scanning a finely-focused beam of primary electrons over a circuit specimen as signals are applied to the specimen. Secondary electrons are thus produced and detected, resulting in a signal used to form an image of the specimen in which intensity variations represent the surface electrical potential on conductors within the specimen. For example, positive voltages appear as dark areas in the image, corresponding to fewer secondary electrons, while zero or negative voltages appear as light areas and correspond to higher secondary electron counts. See, for example, E. Menzel & E. Kubalek, *Fundamentals of Electron Beam Testing of Integrated Circuits*, 5 SCANNING 103-122 (1983), and E. Piles & J. Otto, *Voltage Measurement Inside Integrated Circuit Using Mechanical and Electron Probes*, IV SCANNING ELECTRON MICROSCOPY 1491-1500 (1985).

Commercial introduction by Schlumberger in 1987 of the "IDS 5000 TM" workstation-based, electron-beam test probe system greatly simplified E-beam probing of circuit chips and increased the efficiency of circuit debug. See S. Concina, G. Liu, L. Lattanzi, S. Reyfman & N. Richardson, *Software Integration in a Workstation Based E-Beam Tester*, INTERNATIONAL TEST CONFERENCE PROCEEDINGS (1986); N. Richardson, *E-Beam Probing for VLSI Circuit Debug*, VLSI SYSTEMS DESIGN (1987); S. Concina & N. Richardson *IDS 5000: an Integrated Diagnosis System for* VLSI, 7 MICROELECTRONIC ENGINEERING (1987). See also U.S. Pat. Nos. 4,706,019 and 4,721,909 to N. Richardson, which are incorporated herein by reference.

A block diagram of a prior art electron-beam test probe system is shown at 10 in FIG. 1. The system has three functional elements: an electron beam test probe 12, a circuit exerciser 14, and a data processing system 16 which includes a display terminal 18. The circuit exerciser 14 may be a conventional integrated circuit tester, such as a model "S 15 TM" tester available from Schlumberger Technologies of San Jose, Calif., which can repeatedly apply a pattern of test vectors to the specimen circuit over a bus 24 and provide an indication of whether the specimen circuit has performed in an expected manner in response to each application of the pattern. The specimen circuit is placed in the electron-beam test probe 12 so that potential measurements can be made as the test vector pattern is applied. The points at which such measurements are to be made are sent to the electron-beam test probe 12 by the data processing system 16 over a bus 22. The data processing system 16 may also be used to specify the test signal pattern used and the timing of the potential measurements relative to the test signal pattern. The electron beam test probe system is controlled by an operator who inputs commands through the display terminal 18.

SEMs used for E-beam probing, such as that in the IDS 5000 system, are equipped with high-speed beam pulsing hardware sometimes referred to as a "beam-blanker." An example of such hardware is described in U.S. Pat. No. 4,721,909. Directing a pulse electron beam at a particular node of interest provides a mode of operation much like that of a sampling oscilloscope, in which images can be produced of waveforms at one or more nodes in the specimen circuit as test vector patterns are applied to the specimen circuit. The images may be qualitative (e.g. logic state maps for digital circuit debug), or, with the aid of a secondary electron energy analyzer within the E-beam probe system, quantitative (e.g. analog signal waveforms). Acquisition of high-speed quantitative voltage waveforms with an equivalent bandwidth exceeding 1 GHz are possible. Dynamic faults in the specimen circuit may be readily observed from such waveform images.

For each point of the waveform image, a measurement is made by pulsing the electron beam at a specific time during application of the test vector pattern to the specimen circuit. Since the time needed to make a potential measurement is generally longer than the time over which the test signal pattern remains constant, stroboscopic techniques are used. That is, the electron beam is turned on for a brief period of time at a point in the test signal pattern. Each time the electron beam is so pulsed, a measurement of the potential on a node of the specimen circuit is made. Since a single measurement has insufficient statistical accuracy to allow an accurate determination of the potential, measurements made over many repetitions of the test vector pattern are averaged. Coordination of the electron-beam pulses with the test vector pattern may be effected by a trigger generator circuit of the electron-beam test probe system under control of data processing system 16.

FIG. 2 shows a functional block diagram of portions of an electron beam test probe system configured in prior art manner for acquisition of waveform images from a circuit under test. A trigger signal from tester 14 is provided to a timing controller 30, which in turn supplies beam-pulse timing signals to the electro-optics of the electron-beam probe 12. Potential measurement signals from the electron-beam probe 12 are digitized by an analog-to-digital converter (ADC) 32 under control of a timing signal synchronized with the beam pulse timing signals, and supplied to one input of an arithmetic logic unit (ALU) 34.

A second input of ALU 34 receives digital data from a data buffer 36. ALU 34 is a conventional device which adds the digital data provided at its respective inputs and provides the sum at its output. The sum at the output of ALU 34 is returned to data buffer 36 under control of a data buffer address controller 38. Data bus address controller 38 communicates with timing controller 30 and with a microprocessor 40 via a communication interface 42. Data buffer address controller 38 keeps track of which data relates to which point in the waveform when such data is stored in data buffer 36 so that the data may be composed as a waveform image for display.

In one prior art method of waveform acquisition, the desired waveform image may be made up of values at a number n (for example, 500) of points during the test vector pattern. Each point is assigned an address in data buffer 36. As shown in the timing diagram of FIG. 3, a trigger signal pulse 40 from tester 14 causes timing control circuit 30 to supply a beam pulse 42 to test probe 12 at a time $t_1$ following trigger pulse 40. When a succeeding trigger pulse 44 is produced by tester 14, timing control circuit 30 produces a further beam pulse 46 at a time $t_1$ after trigger pulse 44. Each trigger pulse (40, 44, etc.) typically represents one repetition of the test vector pattern applied to the specimen circuit. Measurements are repeatedly taken at a time $t_1$ following the trigger pulses until a sufficient number of pulses have been acquired and averaged at that time in the test vector sequence to give a meaningful measurement. This may require 10,000 or more repetitions of the test vector sequence for each point in the waveform to be acquired. The process is repeated for a second point in the waveform represented by a time $t_2$ following each of a number of trigger pulses. The repetition continues until an nth point in the waveform is acquired, representing a time $t_n$ following each of a number of trigger pulses.

It can be seen that for even a relatively simple circuit under test, tens of thousands or even hundreds of thousands of repetitions of the test vector pattern may be needed to acquire the data represented in a waveform image.

A rule of thumb commonly applied for setting acquisition parameters is that the duty cycle (the trigger period divided by the beam pulse width) should be less than about 10,000 to 100,000. For example, a 10 MHz microprocessor specimen circuit has a 100 nanosecond clock period; applying a 10,000-vector test pattern means that one complete repetition of the test pattern would require 1 millisecond. To obtain a meaningful measurement at a 10 MHz specimen clock speed, one might employ a 10 nanosecond beam pulse, resulting in a duty cycle of about 100,000. As duty cycles increase, leakage currents and other measurement limitations result in degraded measurement accuracy.

Data acquisition time is also a very real concern, particularly with the lengthy test vector patterns require to exercise ever more complex integrated circuits. With the prior art method of acquiring waveform data illustrated in the timing diagram of FIG. 3, the number of repetitions of the test pattern required to obtain a waveform is equal to the number of points n in the desired waveform multiplied by the number of samples to be averaged at each point in the waveform. For example, if 500 samples are to be averaged at each point in a waveform comprising 500 points, 25,000 repetitions of the test vector sequence are required to acquire the waveform. With the 10 MHz microprocessor specimen mentioned above, and using a 1 millisecond electron-beam pulse, acquiring a waveform of 500 points with 500 beam pulses for each point in the waveform, 250 seconds (more than 4 minutes) would be required for one pass at acquiring the waveform. Depending upon the circuit and the desired measurement, multiple passes might be required to obtain a suitable waveform. FIG. 4 shows a timing diagram of a further prior art waveform acquisition technique, sometimes called "interlacing" or "burst mode imaging." The waveform acquisition technique of FIG. 4 can greatly reduce the number of repetitions of the test vector pattern and, hence, the time needed to acquire a given waveform over the described with reference to FIG. 3. At a time $t_1$ following a trigger pulse 50, a beam pulse 52 is produced. Further beam pulses 54, 56, etc., are produced at an interval 4$\delta t$ following pulse 52, where $\delta t$ represents the time interval between points in the desired waveform. Thus, data is acquired for one fourth of the points in the desired waveform with each repetition of the test pattern. When a desired number of measurements at those points in the waveform have been averaged, the beam pulses are then retarded by a time $\delta t$ such that the first beam pulse 60 follows a a trigger pulse by a time $t_2$, where $t_2$ equals $t_1 + \delta t$. Data is therefore acquired for an additional one quarter of the points on the desired waveform for each repetition of the test pattern. After many repetitions of the test pattern, the beam pulses are again retarded by a time $\delta t$ for acquisition of data at a third quarter of the points in the desired waveform. After many repetitions of the test pattern, the beam pulses are again retarded by a time $\delta t$ for acquistion of data for the remaining points in the desired waveform. In the illustrative example given, only four repetitions of the test pattern are required to obtain a single measurement for each point on the desired waveform. Thus, if a waveform of 500 points is desired, with 500 measurements averaged at each point, a total of 4×500=2,000 repetitions of the test pattern are required to acquire the waveform, using suitable high-speed hardware to process and store the acquired data.

FIG. 5 shows a further prior art configuration of an electron-beam test probe system for acquisition of waveform images in either a synchronous or an asynchronous mode of operation. In the synchronous mode (used for logic analysis when timing information is less critical), the signal on the selected internal node or conductor of the specimen circuit is sampled once per fixed interval of time, typically the period of a user-supplied (external) sync clock signal. The samples so acquired indicate the logic state of the node during each clock period. Synchronous sampling can be performed with external clock rates of, for example, 10 KHz to 200 MHz. However, the maximum beam pulse repetition rate (which is the real sampling rate) is limited by the scintillator bandwidth of the electron-beam test probe which may be, for example, 10 MHz. An interlaced sampling scheme may be used to increase the effective sampling rate. For example, if the external clock frewquency is 100 MHz, during the first pass through the test pattern the electron beam may be pulsed on clock edges 0, 10, 20, 30, etc. During the next pass through the test pattern the beam may be pulsed on clock edges 1, 11, 21, 31, etc. Repeating this 10 times will result in the complete waveform.

The interlacing may be accomplished by a counter/gate & multiplexer circuit shown in block form in FIG. 5, which may be incremented by the external sync clock signal. At the start of each test pattern sequence, the counter is re-set by the trigger signal from the circuit exerciser, via a trigger delay circuit 72. The gate of circuit 70 compares the current clock edge number to the set of clock signal edges for which the electron beam is to be pulsed. If a match occurs, the clock edge is allowed to pass; otherwise it is gated off. The acquisition clock edges output by circuit 70 are passed to a pulse generator 74 which supplies pulses to turn on the electron beam. The output of circuit 70 may also be used to generate addresses for the data buffer memory so that the sample corresponding to clock "1" is stored in location "1" of the buffer memory, and so on.

In the asynchronous (or timing analysis) mode, the signal on the node being probed may be sampled more frequently than the clock frequency of the signal on the node to acquire more accurate timing information, e.g., to detect unexpected signal variations as well as logic level transitions in the signal being observed. For example, a signal with a period of 100 ns can be sampled at 2 ns intervals. This mode can be implemented by means of a restartable oscillator 76 which, when stopped and restarted by a trigger signal, will always start to oscillate exactly in phase with the trigger signal. Once the asynchronous clock signal is generated by oscillator 76, it may be divided in a frequency divider 78 to produce an asynchronous clock signal used for interlacing in the same manner as the sync clock signal is used in the synchronous mode. The asynchronous clock frequency may be set, for example, from 1 MHz to 200 MHz.

The buffer memory bandwidth must be high enough to accept a read-modify-write access at a rate of, for example, every 100 ns. This may be implemented with low cost SRAMs configured in a low-order interleaved memory system as shown in the prior art configuration of FIG. 6. The memory may be divided into eight independent columns 80-96, each of which has its own arithmetic logic unit (ALU) and memory controller. An address generator 98 controls storage locations within the memory columns via address latches 100-116. With such a configuration, each incoming sample may be routed to one of the eight columns depending on the least three bits of the corresponding clock edge number (which may also be used as the memory address). It has been found that, with one such arrangement, the read-modify-write cycle takes 400 ns while the incoming samples can arrive at a maximum rate of one per 100 ns. So, at any time, up to four of these columns will be simultaneously but independently performing a read-modify-write access. The memory is preferably capable of storing 256K 16-bit samples in a buffer accessible to the data processing system of the electron-beam test probe system.

A display is preferably provided on the display terminal of the electron-beam test probe system in a form modeled on a conventional logic analyzer. Such a display provides the user with a tool whose operation is, as far as possible, intuitive by analogy with the logic analyzer model. It is preferred that extensive use of pop-up menus and icons be made and, wherever possible, the user be shielded from the physics of the actual measurement process.

The prior art methods and arrangements described above provide a single channel of waveform acquisition. Prior art multi-channel tools are also known in which multiple "probes" (probe icons) may be placed on the SEM tool window of the display terminal of the electron-beam test probe system. See, for example S. Concina and N. Richardson, *Workstation Driven E-Beam Prober*, INTERNATIONAL TEST CONFERENCE PROCEEDINGS, pp. 554-560 (1987). That is, in the window displaying a live voltage-contrast image of the specimen circuit, an icon is placed where the specimen circuit is to be probed. The system then sequentially acquires a logic waveform at for each probe location and displays the waveform images.

FIG. 7 is a photograph of an electron-beam test probe system display showing a voltage contrast image of conductors of a specimen circuit along with waveform images representing acquired signals at user-specified nodes of the specimen circuit. In the background window is a voltage contrast image of conductors of the specimen circuit. Probe icons (such as those labeled 0, 3, 4, 5, 6 and 7 in FIG. 7) placed in the image by the user show the conductors to be measured. The electron-beam test probe system can then direct the electron beam to the correct nodes to determine the logic state of the conductor. The sampling rate of the beam is kept close to the maximum allowable, for example, 10 MHz. This is achieved by generating multiple beam pulses per trigger signal and using high-speed digital signal processing to capture, process and manipulate the resulting data stream in conventional fashion as described above. The logic waveform for a single conductor can typically be measured in much less than one second (but is of course still dependent on the trigger rate, which is related to the test vector pattern length). Thus, the state of a complete 16 or 32-bit bus can be readily determined in a few seconds. Once data has been acquired, it can be compared directly with either similar results from another device or simulation and test vectors.

Shown in the foreground window of FIG. 7 is a series of waveform images wave0-wave7 acquired at corresponding selected locations 0-7 of the specimen circuit (icons representing probe locations 1 and 2, corresponding to waveform images wave1 and wave2, are not seen in FIG. 7 as they are hidden by the "Logic Analyzer" window in the foreground). Light-colored blocks at the right-hand portion of waveform image wave2 represent acquired data which is inconclusive as to whether the probed location is at a logic "1" or logic "0" state.

Electron-beam test probe systems may be employed not only to acquire qualitative (logic state) waveforms as described above, but also to acquire quantitative (voltage level, or analog) waveforms. FIG. 8 shows in schematic block form a prior-art example of how this may be done. The filter electrode 120 of the electron-beam column is placed between the specimen device under test (DUT) 122 and the scintillator 124 of the electron-beam column. A voltage V is applied to electrode 120 such that the secondary electrons 126 experience a retarding field. The number of electrons with sufficient energy to overcome the potential barrier presented by electrode 120 is governed by the surface potential of the specimen 122. A feedback loop formed by a gate 132 and an integrator 134, and supplied by a constant-current source 130, is used to vary the potential of the filter electrode in a manner that maintains constant the number of electrons detected and, therefore the current of photomultiplier tube (PMT) 128. Gate 132 is closed once during each beam-pulse interval, so that the voltage on the filter electrode 120 tracks variations in the surface potential of the specimen 122.

An underlying premise of the waveform acquisition techniques described above is that the specimen circuit always fails in exactly the same way, i.e., that the failure is repeated during each repetition of the test pattern, or at least during a high enough percentage of the repetitions of the test pattern that averaging of the acquired data produces a waveform image from which the failure can be diagnosed. In practice, it has been found that perhaps 75%-80% of IC failures are of this type.

However, some ICs fail only intermittently, e.g., one or two times out of 10 repetitions of the test pattern. In such case, it is important to know whether acquired data represents the expected ("correct" or "good") performance of the specimen circuit or represents a "failing" performance of the specimen circuit, since averaging data from both good and failing performances often does not provide a waveform image useful in diagnosing the causes of the failing performances. Traditionally, it has not been possible to address this class of problem with electron-beam test probe systems because it is, by definition, not possible to cause the device to fail repeatedly. Instead, engineers were forced to change device operating parameters (such as supply voltage, operating speed or temperature) in such a way that the failure mechanism was not intermittent. This is time-consuming, often inconvenient and sometimes impossible.

It is an object of an embodiment of the present invention to provide methods and apparatus for acquiring data representing intermittent failure of a specimen circuit, while rejecting data from good performances of the specimen circuit, such that waveform images representing failing performances may be produced. Such images can be an invaluable aid in diagnosing the sources and/or causes the intermittent failure.

SUMMARY OF THE INVENTION

The foregoing and other objects are attained with embodiments of th methods and apparatus of the present invention. The present invention provides for a conditional signal acquisition mode which addresses this requirement. Data is acquired in the normal manner on each pass through the test pattern. However, at the end of each test pattern execution a pass/fail signal from the tester is used to reject or accept the data. In this fashion, it is possible to accumulate only that data which carried information about the failure of interest and to reject data which does not. Over several test pattern repetitions it is possible to display only that data which shows the failure. Engineers are thus able to efficiently diagnose intermittent failures without the need to change device operating parameters.

In accordance with one form of the invention, a method is provided for acquiring data representing intermittent failure of the circuit, comprising the steps of: (a) probing the circuit during application of a pattern of test vectors to the circuit to acquire data representing an operating parameter of the circuit; (b) determining whether the circuit has failed to operate in an expected manner in response to the applied pattern; (c) repeating steps (a)–(b); and (d) summing the acquired data from a plurality of repetitions of steps (a)-(b) in which the circuit is determined to have failed to operate in the expected manner. The method is preferably performed with the aid of the aforementioned "interlacing" technique. The method may be used to prepare logic state maps and/or analog waveforms.

Apparatus is also provided for acquiring data representing intermittent failure of a circuit. In one form of the invention, the apparatus includes first and second data storage buffers, and means for (a) defining the first storage buffer as a "good-data" buffer and the second data storage buffer as a "temporary-data" buffer; (b) probing the circuit during application of a pattern of test vectors to the circuit to acquire data representing an operating parameter of the circuit; (c) adding the acquired data with stored data from the "good-data" buffer, and storing the sum in the "temporary-data" buffer; (d) determining whether the circuit has failed to operate in an expected manner in response to application of the pattern and, if the circuit has failed to operate in the expected manner, re-defining the second buffer as a "good-data" buffer and the first buffer as a "temporary-data" buffer; and (e) repeating steps (b)–(d), whereby data stored in the "good-data" buffer comprises a sum of acquired data representing at least one operating parameter of the circuit when the circuit is failing.

By testing whether the specimen circuit has operated as expected during a given repetition of the test pattern, and averaging only data representing failing operation of the specimen circuit, it is possible to construct a waveform representing the intermittent failure of the specimen circuit, even where the failure occurs only during a very small fraction of the test pattern repetitions.

Preferred embodiments of the method and apparatus of the present invention are described in detail below with reference to the accompanying drawing, in which:

DETAILED DESCRIPTION OF THE INVENTION

Figure 9:
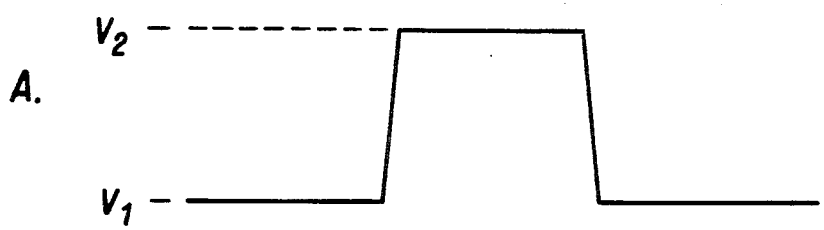
FIG. 9 shows waveforms illustrating the difficulties of acquiring useful waveform images from specimen circuits which exhibit intermittent failure.
Figure 9:
Figure 9:
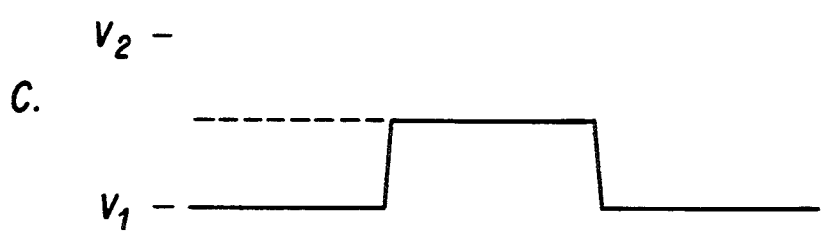
Figure 9:
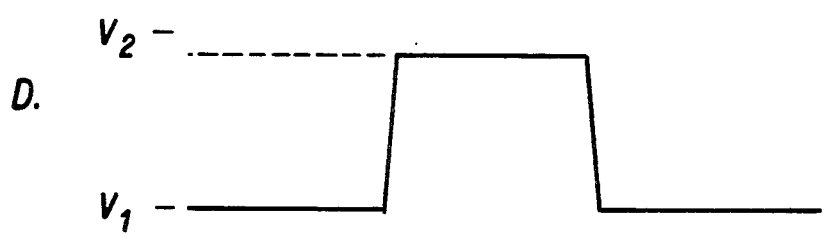
Figure 9:

FIG. 9 shows a series of waveforms which illustrate the difficulty of obtaining suitable diagnostic data from circuits which felt intermittently. Line A shows an expected waveform from a location within a speciment circuit to which a test vector patern has been applied. The logic state changes from a level $V_1$ to a level $V_2$, and returns to level $V_1$. Line B of FIG. 9 shows an example of a possible waveform at the same location within the specimen during failure. If the circuit under test is failing 50% of the time, an average of data acquired from a number of failing and successful test pattern repetitions might produce a waveform such as shown in line C of FIG. 9, in which the signal at the location of interest changes form a level $V_1$ to a level midway between $V_1$ and $V_2$, and returns to a level $V_1$. An engineer faced with diagnosing the intermittent failure of such a chip might or might not detect the difference between the signal on line C and the signal on line A of FIG. 9.

However, if the failure occurs only once out of each ten repetitious of the test pattern, an average of a large number of repetitions of the test pattern might result in a waveform image such as illustrated in line D of FIG. 9. In such case, the waveform image rises from a level $V_1$ to a level representing about 90% of the difference between levels $V_1$ and $V_2$, and then returns to level $V_1$. The likelihood of an engineer recognizing the very slight difference between the waveform images of lines A and D of FIG. 9 is small. And, the less frequently the intermittent failure occurs, the more difficult the engineer's task to discover subtle differences between waveform images acquired with the electron-beam probe test system.

Figure 10:
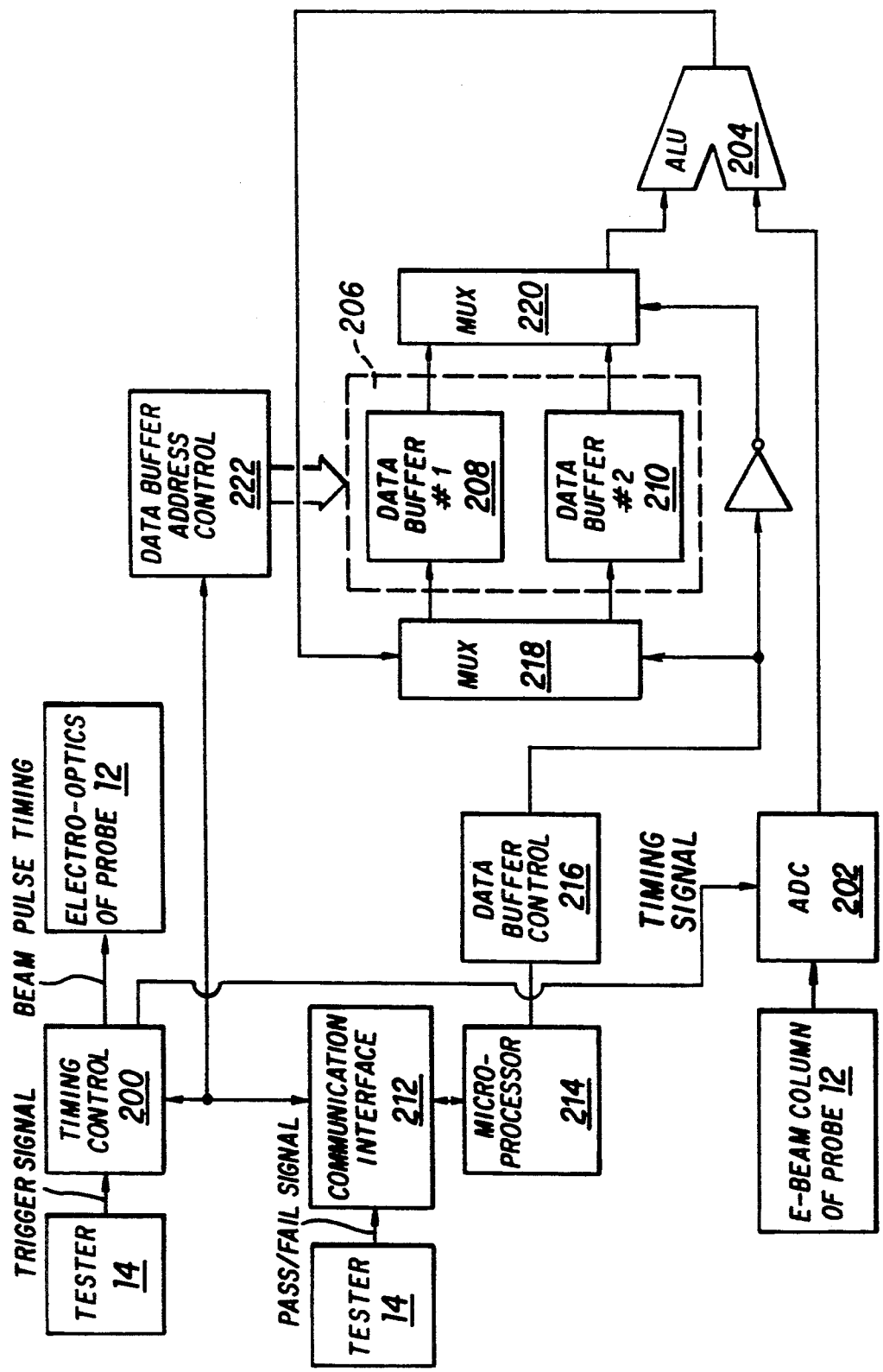
FIG. 10 is a block diagram of a portion of an electron-beam test probe system configured in accordance with the present invention for acquisition of logic state waveform data from a specimen circuit exhibiting intermittent failure.

One embodiment of the present invention is illustrated in the block diagram of FIG. 10. A trigger signal from tester 14 is provided to a timing control circuit 200 which, in turn, provides beam pulse timing signals to the electro-optics of the electron beam column in conventional fashion. Signals (representing acquired data) from the electron beam column are converted to digital form by an analo-to-digital converter (ADC) 202, under control of a timing signal synchronized with the beam pulse timing. The digitized data from ADC 202 is provided to one input of a conventional arithmetic logic unit (ALU) 204. A data storage memory 206 is divided into equal halves; a first data buffer 208 and a second data buffer 210. One of data buffers 208, 210 is initially defined as a "good-data" buffer and the other is defined as a "temporary-data" buffer. During a pass through the test vector sequence, data in the "good-data" buffer is added to the incoming data from ADC 202 in ALU 204 and the result is stored in the corresponding location in the "temporary-data" buffer. At the end of each vector sequence, a status line from the tester 14 is examined to determine whether the circuit has performed as expected or has failed to perform as expected in response to the applied test vector pattern. If the circuit "passed" the just-completed test vector sequence, the pass/fail signal from the tester indicates that the data just acquired should be discarded, which is done by simply continuing to treat the "good-data" buffer as the "good-data" buffer and the "temporary-data" buffer as the "temporary-data" buffer during the next cycle, since the "temporary-data" buffer in this case contains undesired information.

If, however, the tester pass/fail signal indicates that the device under test has failed the test sequence, the roles of data buffers 208, 210 are reversed: the "temporary-data" buffer becomes the "good-data" buffer and vice-versa during the next test cycle. In this manner, data samples can be acquired at a node in the specimen circuit under test during only those test cycles in which the circuit failed.

As shown schematically in FIG. 10, the pass/fail signal from tester 14 is provided, to a communication interface 212 which communicates with a microprocessor 214 of the electron beam test probe system. The communication interface 212 and microprocessor 214 are of conventional design and preferably embodied in a workstation (such as available from Sun Microsystems) incorporated in the electron beam test probe system. A data buffer controller 216 under control of microprocessor 214 provides control signals to data multiplexers 218 and 220 for purposes of controlling which of data buffers 208 and 210 is to be treated as the "good-data" buffer and which of data buffers 208 and 210 is to be treated as the "temporary-data" buffer for a given test pattern cycle. A data buffer address controller 212 receives timing information from timing control circuit 200 which permits controller 222 to coordinate storage of data in buffers 208 and 210 such that stored data is identified with a particular point on the waveform image to be displayed.

Figure 11:
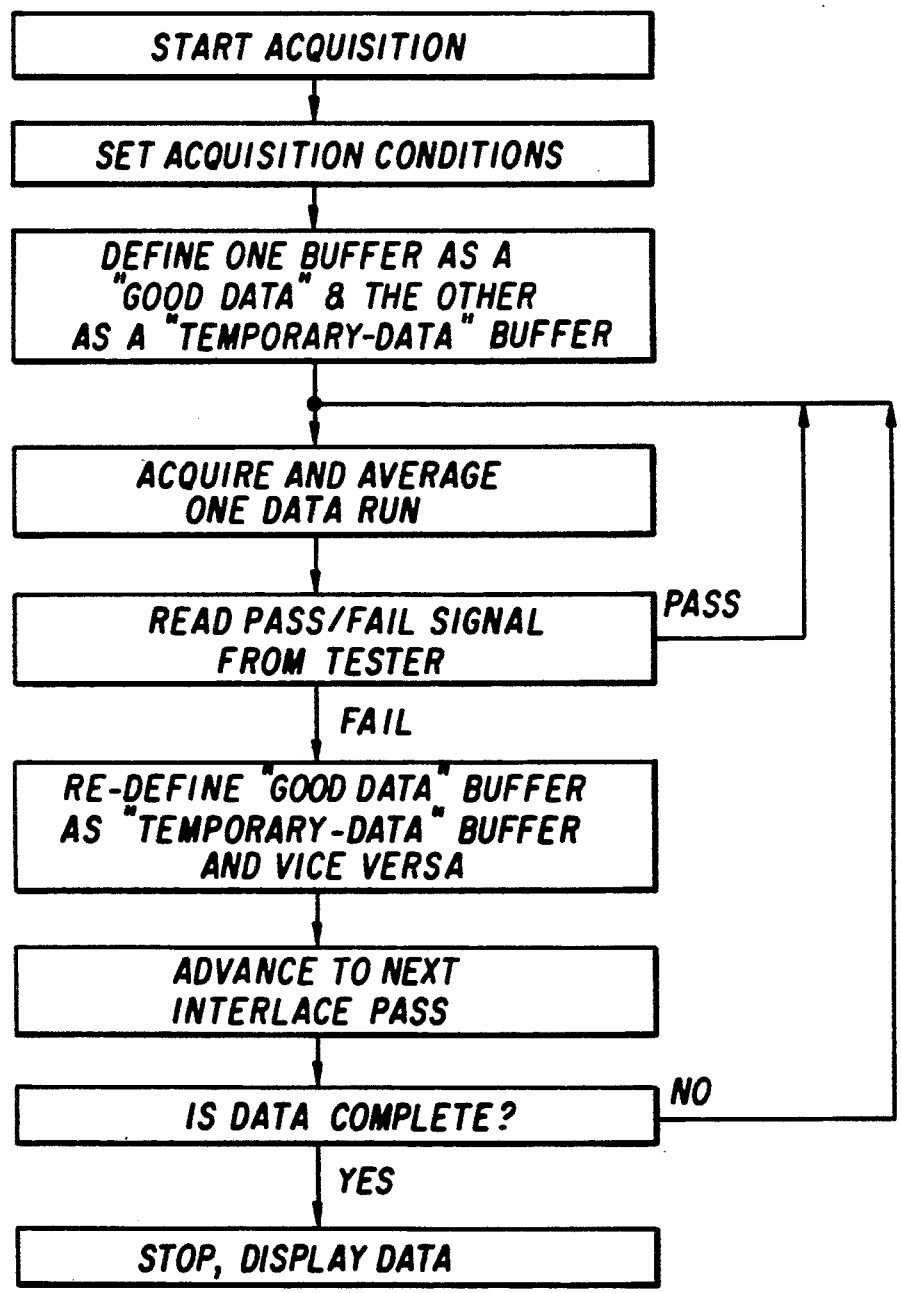
FIG. 11 is a flow chart of the operation of the electron beam tester configured as shown in FIG. 10.

FIG. 11 shows a flow chart of the operation of the configuration of FIG. 10. Prior to commencing the process described in FIG. 11, operating parameters of the tester (such as the test vector pattern) and the electron-beam test probe system (such as beam pulse width, interlace ratio, sampling rate) are established by the user, and the specimen circuit (device under test, or DUT) is installed for test and probing. As the specimen circuit is exercised by application of the test vector pattern, data acquisition begins. Acquisition conditions (such as the electron-beam pulse width, interlace ratio and sampling rate) are set, and one of data buffers 208 and 210 (for example, data buffer 208) is set as the "acquisition" (or "good-data") buffer. Data is then acquired during one pass (or "repetition") of the test vector pattern, the newly-acquired data is added to data in the "good-data" buffer through suitable control of multiplexers 218 and 220, and the resulting sum is stored in "temporary data" buffer (in this case, data buffer 210).

The pass/fail signal from tester 14 is then checked to see whether the circuit under test has performed as expected or has failed during application of the just-completed test vector sequence. If the circuit has performed as expected, buffeer 208 remains the "good-data" buffer and buffer 210 remains the "temporary-data" buffer; if the circuit has failed during the just-completed cycle, buffer 210 is re-defined as the "good-data" buffer and buffer 208 is re-defined as the "temporary-data" buffer.

Figure 1:
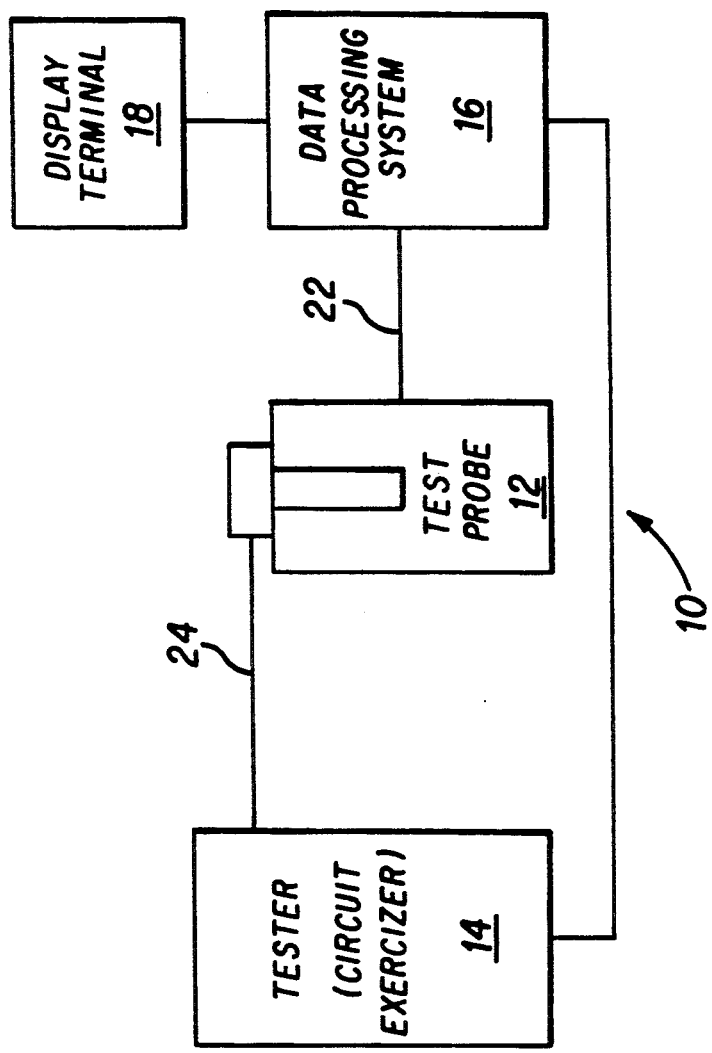
FIG. 1 is a block diagram of a prior art electron-beam test probe system.
Figure 2:
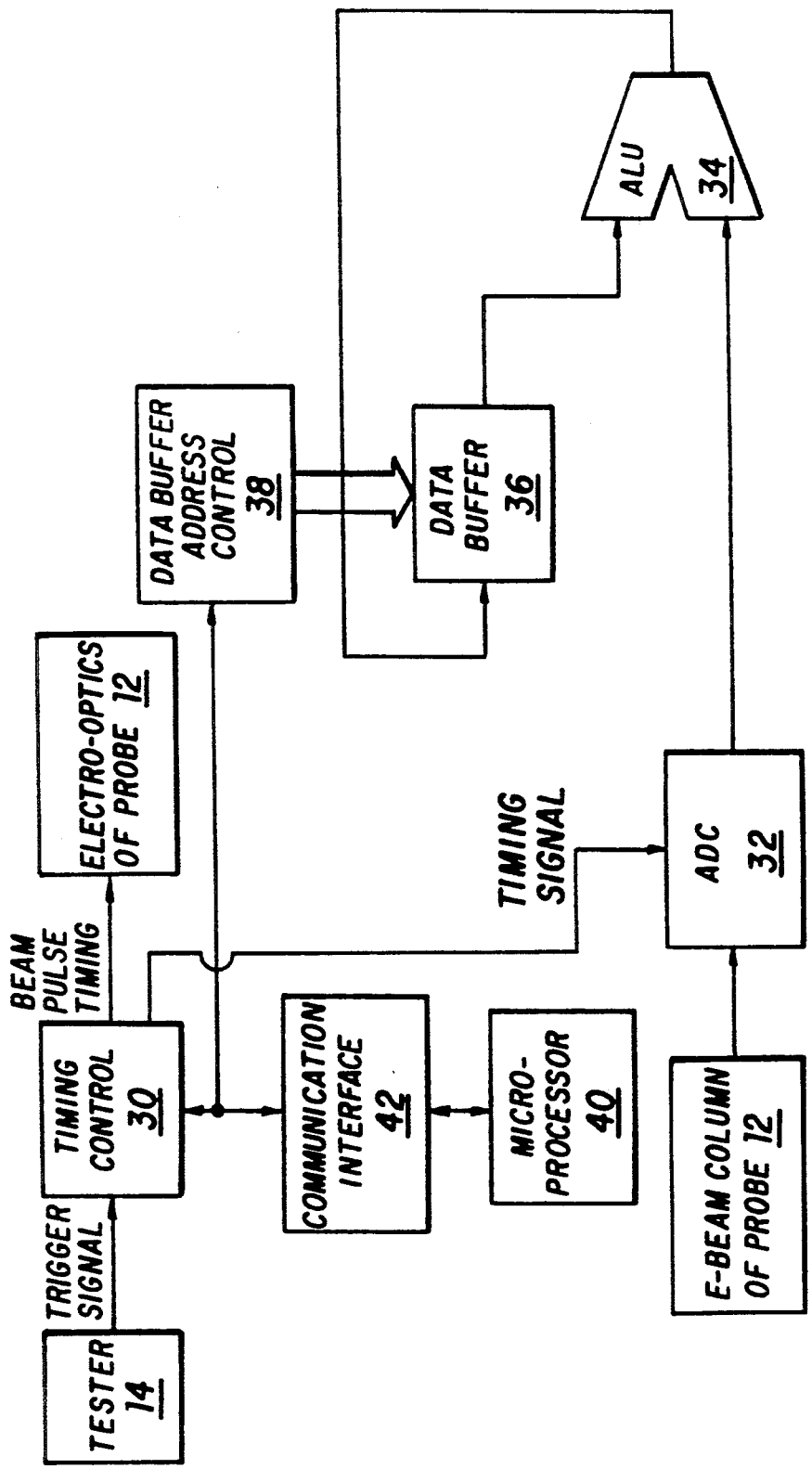
FIG. 2 is a block diagram of a portion of an electron-beam test probe system configured in prior art fashion for qualitative waveform data acquisition.
Figure 3:
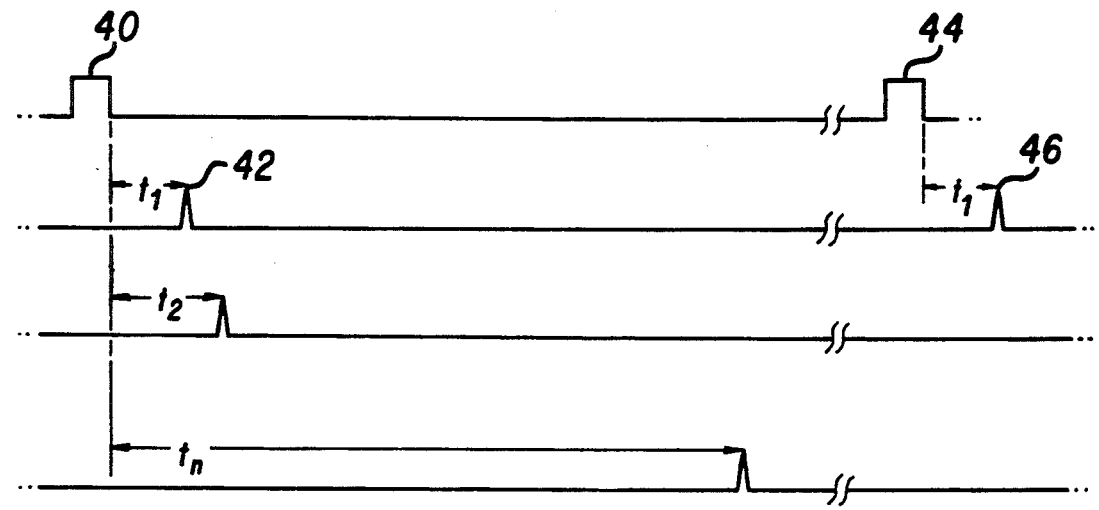
FIG. 3 is a timing diagram illustrating a prior art method of waveform data acquisition with an electron-beam test probe system.
Figure 4:
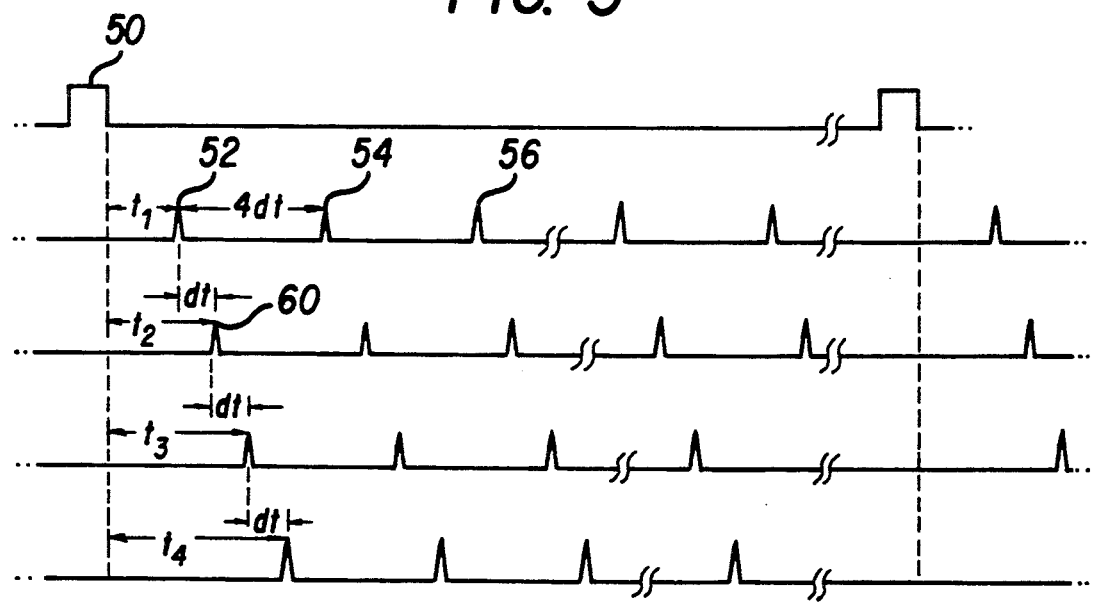
FIG. 4 is a timing diagram illustrating a prior art method of "interlacing" beam pulses for acquisition of data at multiple points of a waveform during each test pattern repetition.
Figure 5:
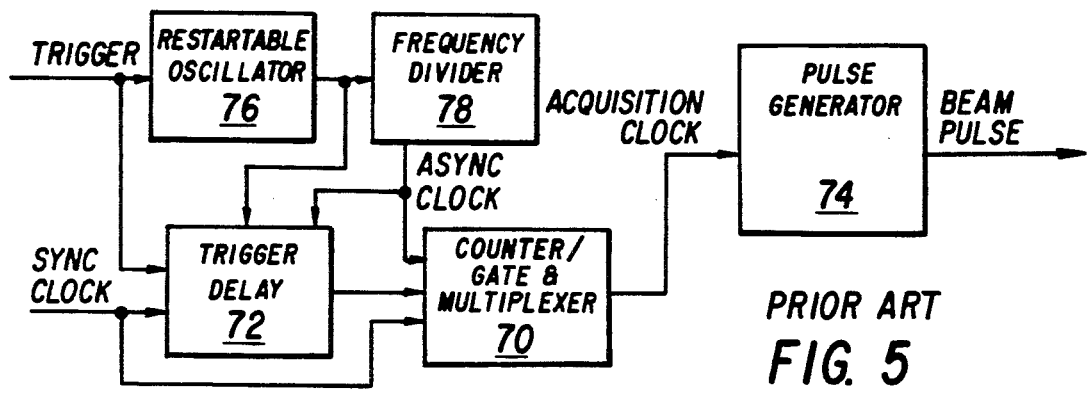
FIGS. 5 and 6 are block diagrams of portions of an electron-beam test probe system configured in prior art fashion for asynchronous or synchronous waveform data acquisition.
Figure 6:
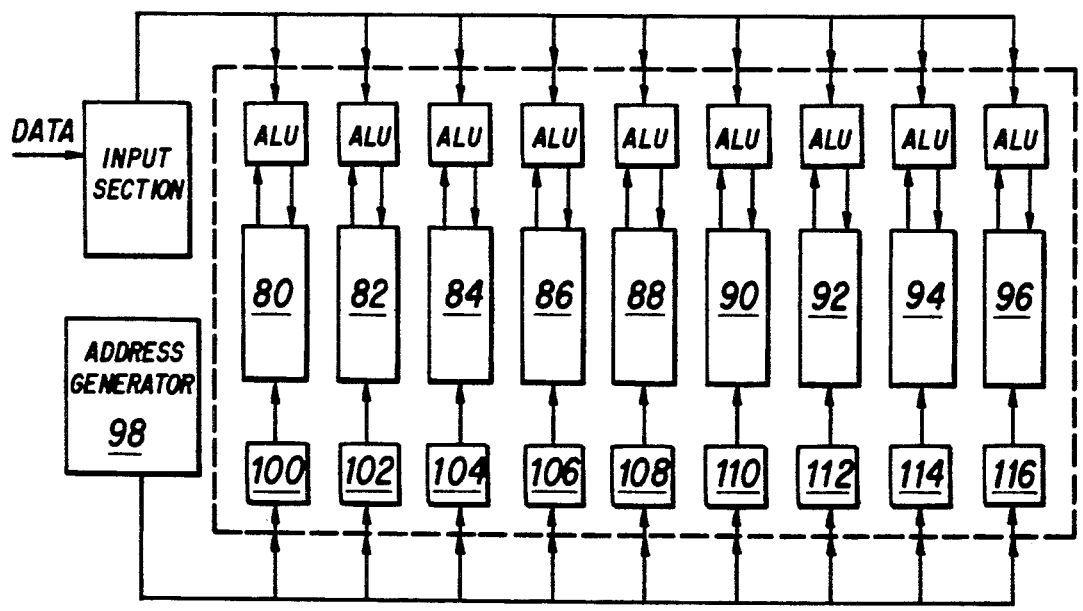
Figure 7:
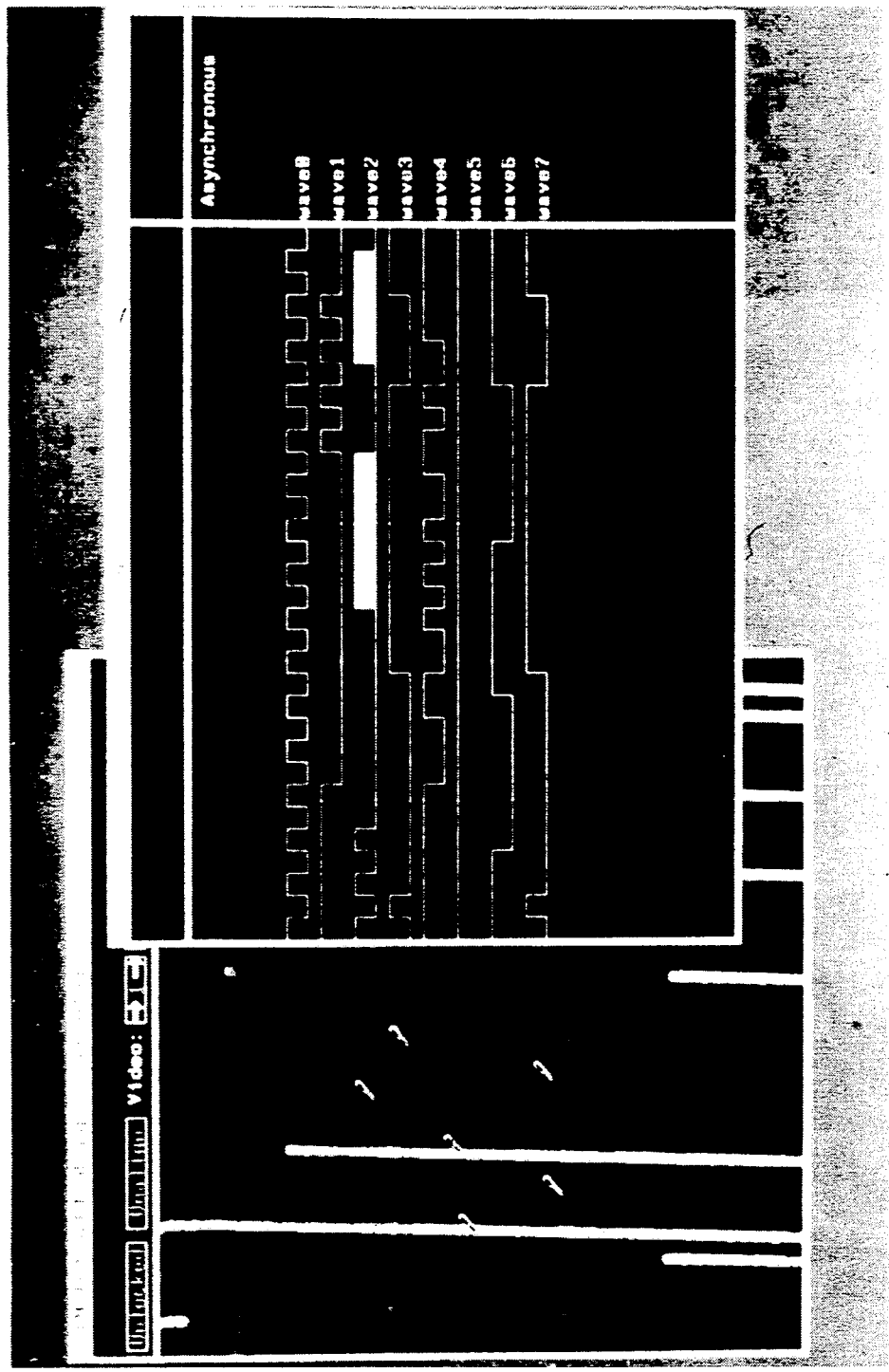
FIG. 7 is a photograph of a prior art electron-beam test probe system display showing a voltage contrast image of conductors of a specimen circuit along with waveform images representing acquired signals at certain nodes of the specimen circuit.
Figure 8:
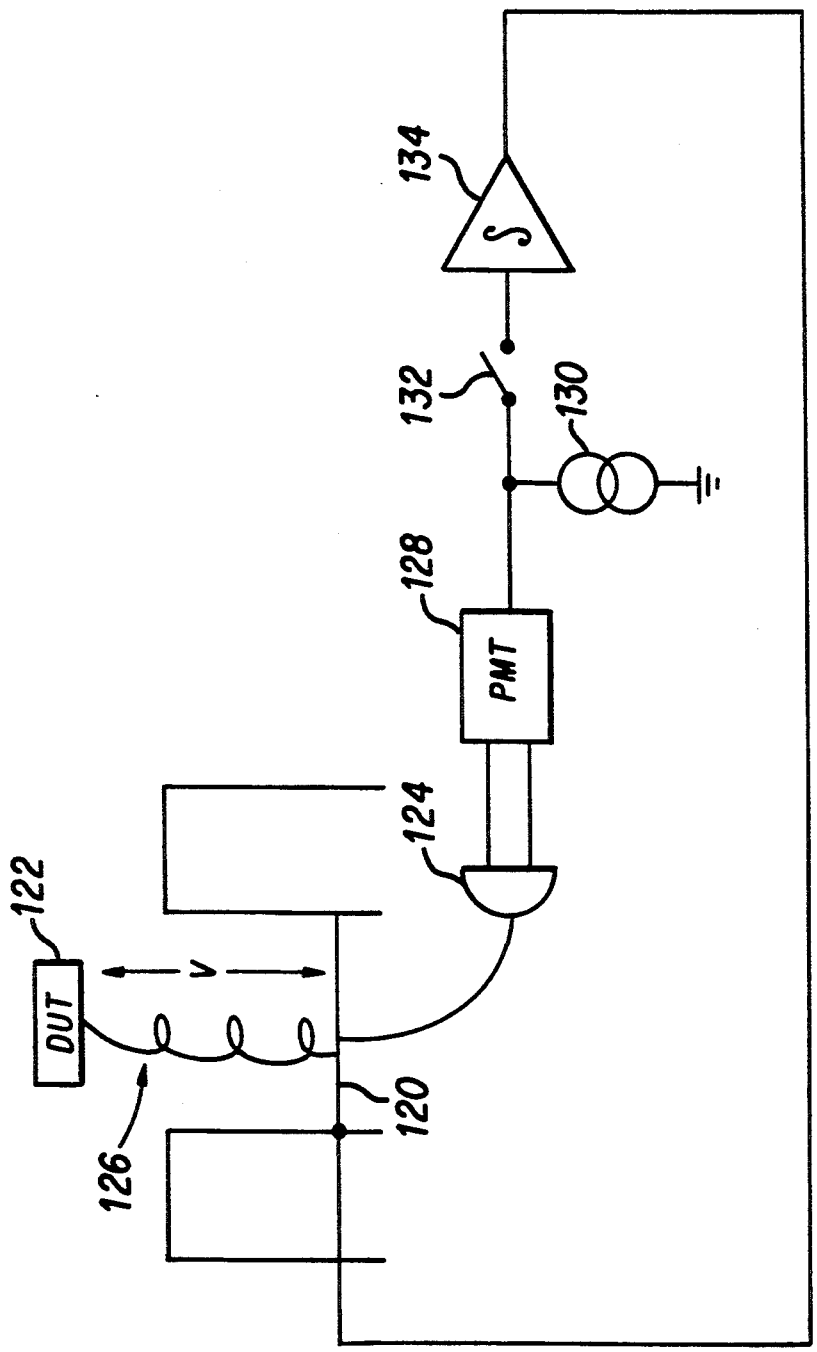
FIG. 8 is a block diagram of a portion of an electron beam test probe system configured in prior art fashion for acquisition of quantitative waveform images.

The test pattern is then repeated until the data is "complete", e.g., a predetermined integer multiple of complete interlaced sample sets has been acquired and averaged, so that a waveform image can be displayed for analysis by the engineer. The display may be in the form shown in FIG. 7.

Figure 12:
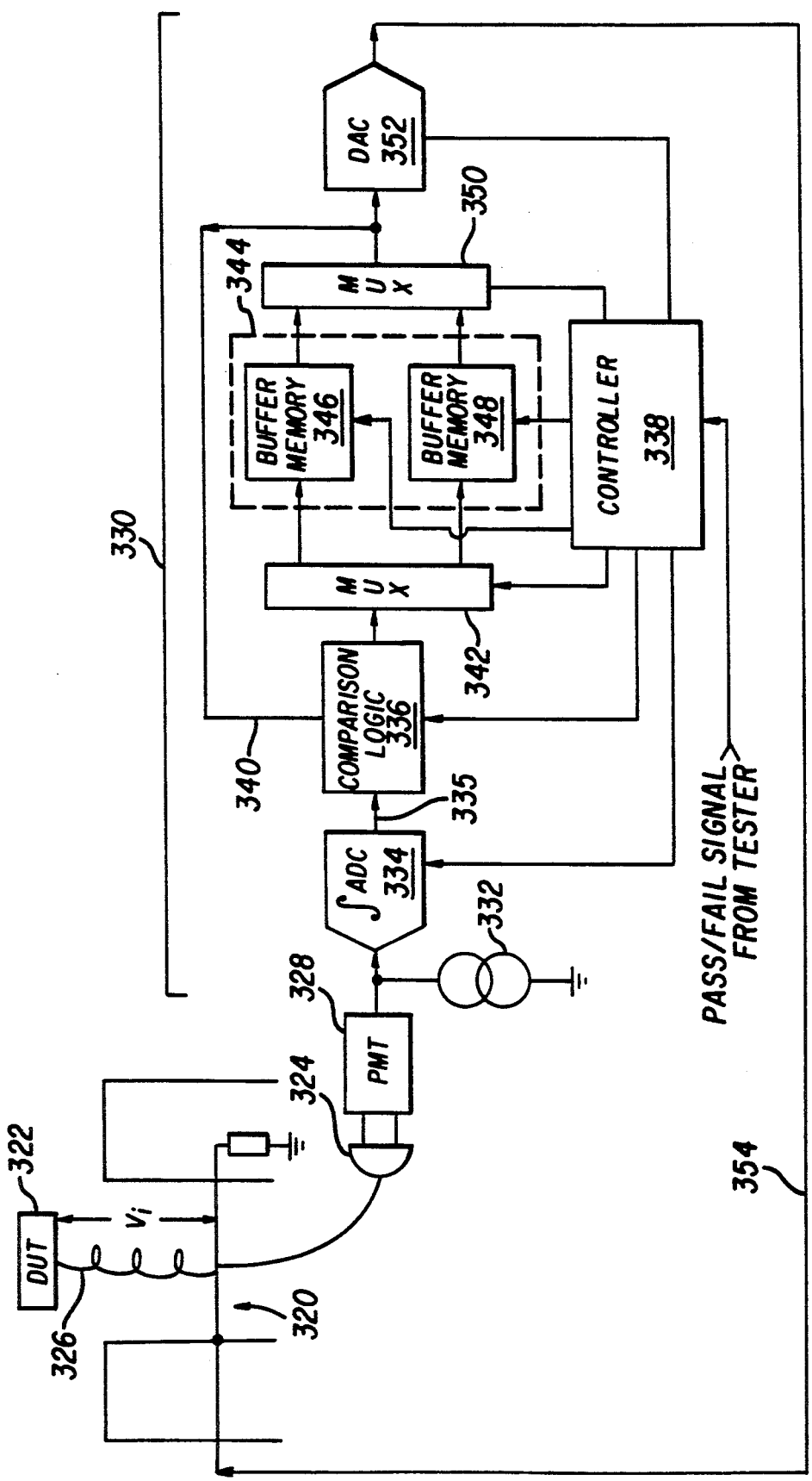
FIG. 12 is a block diagram of a portion of an electron-beam test probe system configured in accordance with the present invention for acquisition of quantitative waveform data from a specimen circuit exhibiting intermittent failure.

FIG. 12 is a block diagram of a portion of an electron-beam test probe system configured in accordance with the present invention for acquisition of quantitative waveform data from a specimen circuit exhibiting intermittent failure. The filter electrode 320 of the electron-beam column is placed between the specimen device under test (DUT) 322 and the scintillator 324 of the electron-beam column. A voltage $V_i$ is applied to electrode 320 such that the secondary electrons 326 experience a retarding field. The number of electrons with sufficient energy to overcome the potential barrier presented by electrode 320 is governed by the surface potential of the specimen 322. A feedback loop formed by a sampling circuit 330 samples the signal from PMT 328 when the electron beam is pulsed on, and maintains a fixed current out of the detector of PMT 328 to maintain voltage $V_i$ constant.

A preferred structure of the sampling circuit 330 is shown in FIG. 12. An integrating analog-to-digital converter (ADC) 334 is connected to the output of PMT 328, to the output of a constant-current source 332, and to a controller 338. ADC 334 digitizes the signal at its input under control of timing signals from controller 338, and supplies the digital output signal to a comparison logic circuit 336. Comparison logic circuit 336 receives control signals from controller 338 and digital feedback signals on line 340 form the output of a digital-to-analog converter (DAC) 352 for purposes described below. The comparison logic circuit 336 performs a programmable rolling average function by summing a fraction of the input signal on line 335 from the ADC 334 and a fraction of the digital feedback signal on line 340. The programmable averaging value is determined by the choice of the fractional coefficient; it allows the user to trade off loop settling time against signal-to-noise ratio. If a fractional coefficient $\alpha$ is applied to the input signal on line 335 from the ADC, a fractional coefficient $1-\alpha$ is applied to the digital feedback signal on line 340. Digital output signals from comparison logic 336 are passed via a multiplexer (MUX) 342 to a digital memory 344. Memory 344 may be a 32-bit-wide, 5000-word memory, for example. Memory 344 is divided into buffer memory halves 346 and 348 which receive address control signals from controller 338. Digital output signals from memory 344 are passed via a multiplexer (MUX) 350 to a digital-to-analog converter (DAC) 352 which oeprates under control of signals from controller 328. The output of DAC 352 is connected to filter electrode 320 via a controlled impedance line 354. Suitable termination, such as a 75 Ω resistor, terminates filter electrode 320 to ground to avoid errors caused by line reflections. Controller 338 has an input connected to receive a pass/fail signal from the tester used to exercise the DUT 322, indicating for each repetition of the applied test vector pattern whether the DUT 322 has or has not performed as expected.

In operation, sampling circuit 330 operates as multiple control "loops" in parallel. Each "loop" operates on a separate sample point in time, such that all sample points combine to show a waveform image as a function of time. As with the qualitative/logic implementation of FIG. 10, one buffer (for example, buffer 346) is initially defined as a "good-data" buffer and the other buffer (for example, buffer 348) is defined as a "temporary-data" buffer. Memory 344 is preferably a 32-bit-wide memory capable of storing two times as many digital "words" as there are sample points in the waveform image to be acquired. A waveform image may have, for example, 5000 sample points. Each time during the test vector pattern at which a measurement (sample) is to be taken is assigned an address in each of the "good-data" and "temporary-data" buffers. At each time during application of the test vector pattern, data retrieved from the corresponding address of the "good-data" buffer is passed to DAC 352 and converted to an analog signal which is applied to filter mesh 320; the output of PMT 328 representing that time in the test vector pattern is digitized and passed (via logic 336 and MUX 342) for storage in the "temporary-data" buffer.

At the conclusion of one application of the test vector pattern to DUT 322, the pass/fail signal from the tester is examined by controller 338. If the DUT 322 performed as expected in response to the just-completed test vector pattern, the "good-data" buffer remains the "good-data" buffer and the "temporary-data" buffer remains the "temporary-data" buffer for the next repetition of the cycle. If the DUT 322 has failed to perform as expected in response to the just-completed test vector pattern, the "good-data" buffer is re-defined as the "temporary-data" buffer and the "temporary-data" buffer is re-defined as the "good-data" buffer for the next repetition of the cycle.

At the conclusion of a suitable number of "failing" repetitions, the data in the "good-data" buffer may be displayed as an analog waveform image in which the value at each point of the image represents the value of a given address in the "good-data" buffer.

ADC 334 operates in a conventional "successive approximation" or "binary search" mode. In the "successive approximation" process, the previous stored sample value is compared with the new sample in comparison logic 336 and a new approximation is generated. In "binary search" mode, the result to be stored is computed one binary bit at a time starting with the most significant bit and working toward the least significant bit. The technique is also sometimes called internal halving, as each successive bit has half the value of the previous bit.

Those of skill in the art will recognize that the present invention is not limited to the specific embodiments described above, and that many modifications are possible within the spirit and scope of the invention as defined in the following claims. For example, the present invention may be practiced with any type of probe system, in single and/or multiple channels, in synchronous or asynchronous acquisition mode, and with any data processing configuration which allows retention and averaging of data from multiple failing executions of a test vector pattern by an intermittently failing circuit.

We claim:

1. A method of acquiring data representing intermittent failure of a circuit, comprising the steps of:
   (a) defining a first data storage buffer as a good-data buffer and a second data storage buffer as a temporary data buffer;
   (b) probing said circuit during application of a pattern of test vectors of said circuit to acquire data representing a quantitative potential measurement of a conductor within said circuit;
   (c) adding said acquired data with stored data from said good-data buffer, and storing the sum in said temporary data buffer;
   (d) determining whether said circuit has failed to operate in an expected manner in response to said pattern and, if said circuit has failed to operate in said expected manner, reversing definitions of said good-data buffer and said temporary-data buffer; and (e) repeating steps (b)-(d), whereby data stored in said good-data buffer comprises a sum of acquired data representing a quantitative potential measurement of a conductor within said circuit when said circuit is failing.

2. The method of claim 1, wherein probing said circuit comprises repeatedly pulsing an electron beam at a location within said circuit and detecting secondary electron emission from said circuit in response to said repeated pulsing during at least one application of said pattern of test vectors to said circuit.

3. The method of claim 2, further comprising the step of displaying said summed data to produce a waveform image representing failing operation of said circuit.

4. The method of claim 2, further comprising the step of displaying said summed data in the form of a logic state map representing failing operation at a location within said circuit.

5. The method of claim 1, further comprising the step of displaying said summed data in the form of an analog waveform image representing quantitative potential levels at a location within said circuit during application of said pattern.

6. Apparatus for acquiring data representing intermittent failure of a circuit, comprising:

(a) a first data buffer initially defined as a good-data buffer and a second data buffer initially defined as a temporary-data buffer;

(b) means for probing said circuit during application of a pattern of test vectors of said circuit to acquire data representing a quantitative potential measurement of a conductor within said circuit;

(c) means for adding said acquired data with stored data from said good-data buffer, and storing the sum in said temporary data buffer;

(d) means for determining whether said circuit has failed to operate in an expected manner in response to said pattern and, if said circuit has failed to operate in said expected manner, reversing the definitions of said good-data buffer and said temporary-data buffer whereby data is stored in said good-data buffer which comprises a sum of acquired data representing a quantitative potential measurement of a conductor within said circuit when said circuit is failing.

7. The apparatus of claim 6, wherein said probing means includes means for repeatedly pulsing an electron beam at a location within said circuit and detecting secondary electron emission from said circuit in response to said repeated pulsing during at least one application of said pattern of test vectors to said circuit.

8. The apparatus of claim 7, further comprising means for displaying said summed data to produce a waveform image representing failing operation of said circuit.

9. The apparatus of claim 7, further comprising means for displaying said summed data in the form of a logic state map representing failing operation at a location within said circuit.

10. The apparatus of claim 6, further comprising means for displaying said summed data in the form of an analog waveform image representing quantitative potential levels at a location within said circuit during application of said pattern.

11. Apparatus for acquiring quantitative waveform data representing intermittent failure of a circuit, comprising:

(a) means for probing a conductor within said circuit, comprising
  i. means for applying an electron beam pulse to said conductor at multiple sampling times during application of a pattern of test vectors to said circuit,
  ii. means (324,328) for detecting energy of secondary electrons from said conductor and producing a detector signal having a level which varies with energy of said secondary electrons, and
  iii. a filter electrode (320) to which a voltage may be applied to produce a field to retard said secondary electrons;

(b) means for indicating whether said circuit has failed to operate in an expected manner in response to said patter; and (c) a sampling circuit (330) responsive to said detector signal and to said indicating means, comprising
  i. means for summing, for each said sampling time, data representing the level of said detector signal from repeated applications of said pattern for which said indicating means indicates that said circuit has failed to operate in an expected manner in response to said pattern, said data comprising acquired quantitative waveform data representing intermittent failure of said circuit, wherein said summing comprising:
    (a) means (332) for supplying a constant current signal;
    (b) means (338) for supplying control signals;
    (c) an integrating analog-to-digital converter (334), said analog-to-digital converter being responsive to said detector signal, to said constant-current signal, and to control signals from said control signal supplying means, and producing a digital output signal;
    (d) comparison logic (336) responsive to said digital output signal, to control signals from said control signal supplyig means, and to a digital feedback signal, for summing a fraction of said digital output signal with a fraction of said digital feedback signal to produce a rolling average signal;
    (e) a memory (334) divided into multi-word buffer memory halves (346,348), said halves responsive to address control signals from said control signal supplying means;
    (f) a first multiplexer (342) responsive to control signals from said control signal supplying means for passing said rolling average signal to said memory;
    (g) a digital-to-analog converter (352) responsive to control signals from said control signal supplying means and to said digital feedback signal for supplying said voltage ($V_i$) to be applied to said filter electrode;
    (h) a second multiplexer (350) responsive to control signals from said control signal supplying means and to data stored in said memory for supplying said digital feedback signal to said comparison logic and to said digital-to-analog converter, and
  ii. means responsive to said summing means for applying a voltage ($V_i$) to said filter electrode, whereby said sampling circuit is connected to form a feedback loop from said detecting means to said filter electrode, said feedback loop serving to maintain a fixed current out of the detecting means to maintain said applied voltage ($V_i$) constant.

* * * * *